United States Patent
Awaga et al.

(10) Patent No.: US 8,300,365 B2
(45) Date of Patent: Oct. 30, 2012

(54) ELECTRONIC SUBSTRATE AND MAGNETIC DISK APPARATUS

(75) Inventors: Kosuke Awaga, Tokyo (JP); Kengo Saruta, Tokyo (JP); Takao Ohmi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 13/021,502

(22) Filed: Feb. 4, 2011

(65) Prior Publication Data
US 2011/0216445 A1    Sep. 8, 2011

(30) Foreign Application Priority Data
Mar. 2, 2010    (JP) .................................. 2010-045832

(51) Int. Cl.
G11B 33/14    (2006.01)
H05K 7/18    (2006.01)
H05K 1/03    (2006.01)
(52) U.S. Cl. .................. 360/264.2; 360/97.12; 361/749; 174/254
(58) Field of Classification Search ............... 360/97.12, 360/264.2; 174/254, 260, 261; 361/749, 361/70
See application file for complete search history.

(56) References Cited

U.S. PATENT DOCUMENTS

| | | | | |
|---|---|---|---|---|
| 5,003,429 A | * | 3/1991 | Baker et al. .................... | 361/704 |
| 5,330,365 A | * | 7/1994 | Leeson ............................ | 439/77 |
| 5,525,760 A | * | 6/1996 | Rohatgi et al. ................. | 174/254 |
| 6,150,614 A | * | 11/2000 | Miller et al. .................... | 174/254 |
| 6,337,840 B1 | | 1/2002 | Nakamura et al. | |
| 6,515,954 B1 | | 2/2003 | Nakamura et al. | |
| 6,728,188 B1 | | 4/2004 | Nakamura et al. | |
| 7,573,727 B2 | * | 8/2009 | Hauenstein et al. ........... | 361/803 |
| 2002/0195228 A1 | * | 12/2002 | Corti et al. ..................... | 165/80.3 |
| 2009/0097161 A1 | | 4/2009 | Naruse et al. | |

FOREIGN PATENT DOCUMENTS

| | | |
|---|---|---|
| JP | 1130585 A | 5/1993 |
| JP | 07-006577 A | 10/1995 |
| JP | 11-73745 | 3/1999 |
| JP | 2002-222401 | 8/2002 |
| JP | 3493750 B | 2/2004 |
| JP | 2009-99163 | 5/2009 |

OTHER PUBLICATIONS

Siegel et al. "Foldable Printed Circuit Boards on Paper Substrates". Adv. Funct. Mater. 2010, 20, 28-35.*
Japanese Application No. 2010-045832 Office Action (Jun. 21, 2011) (English translation attached).

* cited by examiner

Primary Examiner — Julie Anne Watko
(74) Attorney, Agent, or Firm — Patterson & Sheridan, LLP

(57) ABSTRACT

An electronic substrate includes: a flexible printed circuit comprising a head connecting portion being provided with a first terminal to be electrically connected to a magnetic head, and a board connecting portion being provided with a second terminal to be electrically connected to a main printed board; a first reinforcing member provided on the head connecting portion of the flexible printed circuit, the first reinforcing member reinforcing the head connecting portion; and a second reinforcing member provided on the board connecting portion of the flexible printed circuit, the second reinforcing member reinforcing the board connecting portion, wherein the second reinforcing member includes a additional enhancement portion formed with a sterically enhanced shape.

6 Claims, 5 Drawing Sheets

ELECTRONIC SUBSTRATE AND MAGNETIC DISK APPARATUS

CROSS-REFERENCE TO THE RELATED APPLICATION(S)

The present application is based upon and claims priority from prior Japanese Patent Application No. 2010-045832, filed on Mar. 2, 2010, the entire contents of which are incorporated herein by reference.

FIELD

Embodiments described herein generally relate to an electronic substrate and a magnetic disk apparatus provided with the electronic substrate to be electrically connected with a head connecting portion with a flexible printed circuit (FPC).

BACKGROUND

In recent years, in the field of the magnetic disk apparatus, techniques for increasing the rigidity of members have been required. For example, a Japanese Patent No. 3493750 (counterpart U.S. publication is: U.S. Pat. No. 6,052,255) discloses the following techniques. That is, a cover of a magnetic disk apparatus is formed with plastic molding. An elastic member is bonded to an end of each support-post. In an assembled state in which the cover is connected to a base, each elastic member abuts against the base to configure an elastic spacing member. An external force applied to the cover is absorbed via the rigidity of ribs and the deformation of the elastic members caused by the support-posts. Consequently, an amount of deflection of the cover is reduced.

The FPC is flexible and can largely be deformed. Thus, the FPC is used in a magnetic disk apparatus to connect, to a main printed board, a magnetic head that dynamically operates. As described above, the FPC has high flexibility. Thus, connecting portions, such as a magnetic head connecting portion and a printed board connecting portion, are deficient in rigidity. The rigidity of the connecting portions is increased using reinforcing plates. On the other hand, because the weight of the reinforcing plate affects the magnetic head that dynamically operates, the magnetic head connecting portion is required to reduce the weight of the reinforcing plate.

However, manufacturing requirements lead to a requirement that reinforcing plates respectively used in a magnetic head connecting portion and a printed board connecting portion are formed of the same material. To increase the rigidity of the reinforcing plates, it is necessary to thicken the reinforcing plates used in the printed board connecting portion. However, as described above, the magnetic head connecting portion is required to reduce the weight of the reinforcing plate used therein. This requirement involves a different requirement that it is necessary to reduce the thickness of the reinforcing plate, thereby reducing the weight thereof. Techniques for improving this problem have been desired. That is, it is desired to increase the rigidity of the reinforcing plate used in the printed board connecting portion, while reducing the weight of the reinforcing plate used in the magnetic head connecting portion.

BRIEF DESCRIPTION OF THE DRAWINGS

A general configuration that implements the various features of the present invention will be described with reference to the drawings. The drawings and the associated descriptions are provided to illustrate embodiments of the invention and not to limit the scope of the invention.

DETAILED DESCRIPTION

Figure 1:
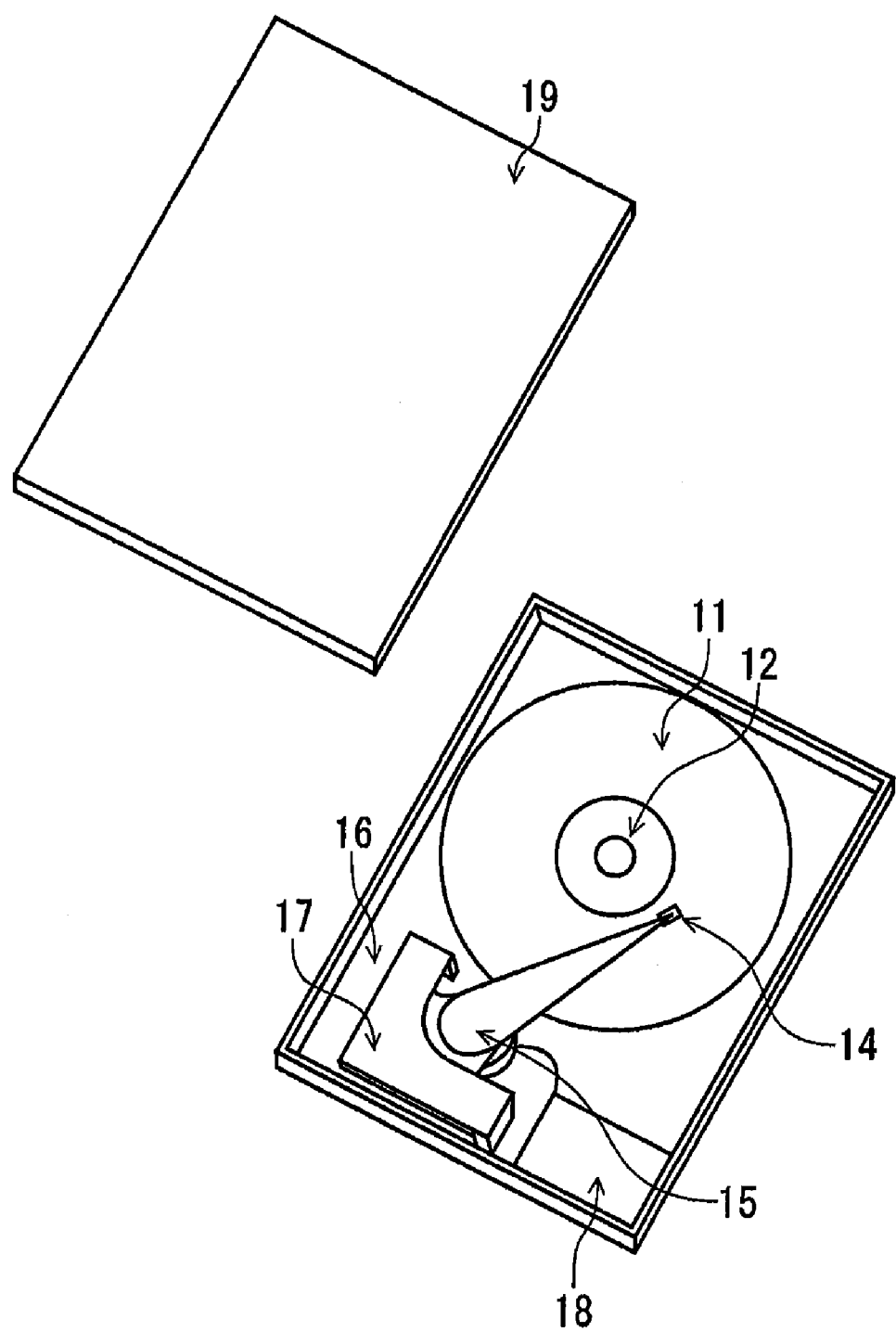
FIG. 1 is a diagram illustrating an example of a magnetic disk apparatus according to an embodiment.

According to the embodiments described herein, there is provided an electronic substrate including: a flexible printed circuit comprising a head connecting portion being provided with a first terminal to be electrically connected to a magnetic head, and a board connecting portion being provided with a second terminal to be electrically connected to a main printed board; a first reinforcing member provided on the head connecting portion of the flexible printed circuit, the first reinforcing member reinforcing the head connecting portion; and a second reinforcing member provided on the board connecting portion of the flexible printed circuit, the second reinforcing member reinforcing the board connecting portion, wherein the second reinforcing member includes a additional enhancement portion formed with a sterically enhanced shape.

There is also provided a magnetic disk apparatus including: a magnetic disk; a magnetic head configured to read information recorded on the magnetic disk; a flexible printed circuit comprising a head connecting portion being provided with a first terminal to be electrically connected to the magnetic head, and a board connecting portion being provided with a second terminal to be electrically connected to a main printed board; a first reinforcing member provided on the head connecting portion of the flexible printed circuit, the first reinforcing member reinforcing the head connecting portion; and a second reinforcing member provided on the board connecting portion of the flexible printed circuit, the second reinforcing member reinforcing the board connecting portion, wherein the second reinforcing member includes a additional enhancement portion formed with a sterically enhanced shape.

Embodiments according to the present invention will be described in detail with reference to the accompanying drawings. The scope of the claimed invention should not be limited to the examples illustrated in the drawings and those described in below.

Hereinafter, embodiments according to the invention are described with reference to the drawings.

FIG. 1 is a diagram illustrating an embodiment of a magnetic disk apparatus according to the invention.

Reference numeral 11 designates a magnetic disk, reference numeral 12 denotes a spindle motor, numeral 14 represents a magnetic head, numeral 15 designates a head actuator, numeral 16 denotes a base, numeral 17 represents a voice coil motor (VCM), and numeral 18 designates an FPC.

The magnetic disk apparatus is configured such that the magnetic disk 11, the spindle motor 12, the magnetic head 14, the head actuator 15, the VCM 17, the FPC 18, and the like are housed in the base 16 whose top surface is opened.

The magnetic disk 14 is supported on the base 16 and rotated by the spindle motor 12. The magnetic head 14 is supported by the head actuator 15 and moves on the magnetic disk 11.

The FPC 18 electrically connects the magnetic head 14 to a main printed board (not shown). A portion of the FPC 18, at which a terminal to be connected to the magnetic head 14 is disposed, is referred to as a head connecting portion 31. Another portion of the FPC 18, at which a terminal to be connected to the main printed board is placed, is referred to as a board connecting portion 32. The magnetic head 14 and the main printed board are electrically connected to each other via the FPC 18. The head connecting portion 31 of the FPC 18 is fixed to the head actuator 15.

A central processing unit (CPU) for controlling the magnetic head 14, a memory, a hard disc drive (HDD) controller, and other circuits are mounted on the main printed board (not shown).

The VCM 17 is located between a pair of yokes fixed to the base 16. The voice coil, together with a magnet (or magnets) attached to one (or both) of yokes, configures the VCM 17. The head actuator 15 having the magnetic head 14 is moved on a magnetic disk 11, energizing the voice coil. Thus, information is magnetically read and written from and to the magnetic disk 11.

Figure 2:
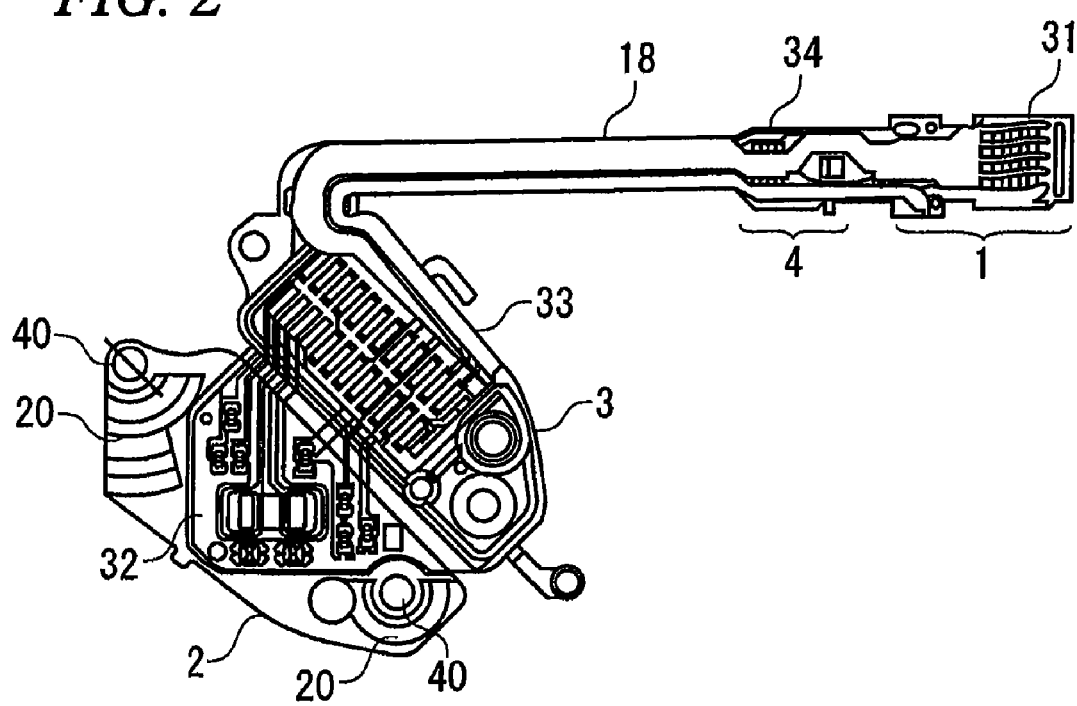
FIG. 2 is a diagram illustrating an example of an electronic substrate having an FPC and reinforcing members according to the embodiment.

FIG. 2 is a diagram illustrating an embodiment of an electronic substrate having an FPC and reinforcing members according to the invention.

Reference numeral 1 designates a first reinforcing member (reinforcing plate), numeral 2 denotes a second reinforcing member (reinforcing plate), numeral 3 represents a third reinforcing member (reinforcing plate), numeral 4 designates a fourth reinforcing member (reinforcing plate), numeral 20 denotes a louvered portion, numeral 31 represents a head connecting portion, numeral 32 designates a board connecting portion, numeral 33 denotes a connector portion, numeral 34 represents a hook portion, and numeral 40 designates a screw portion.

As described above, the FPC 18 electrically connects the magnetic head 14 to the main printed board.

Generally, the FPC is a printed board that is flexible and that can largely be deformed. A flexible cable is a wire that is flexible and that can largely be deformed.

Generally, the FPC is configured by forming an adhesion layer on a film-like insulating member (base film) having a thickness of about 12 microns (µm) to about 50 µm, and further forming, on the adhesion layer, an electrically-conductive-material foil having a thickness of about 12 µm to about 50 µm. The FPC except for a terminal portion and a soldered portion is coated with an insulating material to protect the FPC. The FPC is featured in that the FPC can repeatedly be deformed by a small force, and that even when the FPC is deformed, the FPC maintains electrical properties. Thus, as described above, the FPC is used in a magnetic disk apparatus. Generally, a polyimide film referred to as a coverlay is used as the insulating material. Alternatively, a photo solder resist film is used as the insulating material. Generally, copper is used as the electrically conductive material.

The FPC 18 is provided with the head connecting portion 31 in which a terminal for connecting the FPC 18 to the magnetic head 14 is disposed, and with the board connecting portion 32 in which a terminal for connecting the FPC 18 to the main printed board is disposed. As described above, the head connecting portion 31 and the board connecting portion 32 are connected to each other with wiring formed of the electrically-conductive-material foil. That is, the magnetic head 14 and the main printed board are electrically connected to each other via the FPC 18.

As described above, the FPC 18 has flexibility. Thus, the FPC 18 needs reinforcing, if necessary. In this embodiment, a first reinforcing member (reinforcing plate) 1 is added to the head connecting portion 31 of the FPC 18. Thus, the head connecting portion 31 is reinforced. In this embodiment, the first reinforcing member (reinforcing plate) 1 is formed of a SUS-plate (stainless-steel plate). The SUS is stainless steel. The SUS is alloy steel produced to contain chrome and nickel to make the SUS corrosion-resistant. The SUS is referred to as "stainless steel", or as "fushuko" in Japanese. The SUS is also referred to simply as "stainless" or "stain." The SUS is a brevity code determined according to Japanese industrial standards (JIS). Usually, the SUS is pronounced as "sas" in Japanese.

The head connecting portion 31 to which the first reinforcing member (reinforcing plate) 1 is attached is fixed to the head actuator 15.

In addition, similarly, a second reinforcing member (reinforcing plate) 2 formed of a SUS-plate is attached to the board connecting portion 32 of the FPC 18. Thus, the board connecting portion 32 is reinforced.

A connector (not shown) is connected to the connector portion 33. The connector is connected to the main printed board. Thus, the connector is connected to the CPU for controlling the magnetic head 14, the memory, the HDD controller, and other circuits, which are not shown in the drawings.

Similarly, a third reinforcing member (reinforcing plate) 3 formed of a SUS-plate is attached to the connector portion 33. Thus, the connector portion 33 is reinforced.

In this embodiment, the FPC 18 is partly bent to make the board connecting portion 32 reinforced with the second reinforcing member (reinforcing plate) 2 and the connector portion 33 reinforced with the third reinforcing member (reinforcing plate) 3 overlap each other.

Similarly, a fourth reinforcing member (reinforcing plate) 4 formed of a SUS-plate is attached to the hook portion 34 of the FPC 18. Thus, the hook portion 34 is reinforced.

In this embodiment, the FPC 18 is partly bent to make the head connecting portion 31 reinforced with the first reinforcing member (reinforcing plate) 1 and the hook portion 34 reinforced with the fourth reinforcing member (reinforcing plate) 4 overlap each other. The head connecting portion 31 to which the first reinforcing member (reinforcing plate) 1 is attached is fixed to the head actuator 15, together with the hook portion 34 reinforced with the fourth reinforcing member (reinforcing plate) 4.

The second reinforcing member (reinforcing plate) 2 is provided with a screw portion 40 for fixing the FPC 18 with a screw (not shown).

Meanwhile, as described above, the portions of the FPC, which are deficient in rigidity, are increased in rigidity, using the reinforcing plates formed of a SUS-plate or the like. However, the magnetic head connecting portions 31 has problems that the weight of the first reinforcing plate 1 affects the center of gravity of the head actuator 15 and the like and thus affects the magnetic head which operates dynamically. Accordingly, it has been required to reduce the weight of the reinforcing plate.

However, a different request has been made from a manufacturing viewpoint.

That is, it has been requested that the first reinforcing plate 1 used in the magnetic head connecting portion 31 and the second reinforcing plate 2 used in the board connecting portion 32 are formed of materials having similar properties (i.e., having as same properties as possible).

However, it is necessary for increasing the rigidity of the second reinforcing plate 2 used in the board connecting portion 32 to thicken the reinforcing plate 2. On the other hand, it is requested to reduce the weight of the magnetic head connecting portion 31. It is necessary therefor to reduce the thickness of the first reinforcing plate 1 and the weight thereof. Accordingly, techniques for solving both problems have been desired. That is, it has been a problem to achieve both of reduction in the weight of the first reinforcing plate 1 used in the magnetic head connecting portion 31 and increase in the rigidity of the second reinforcing plate 2 used in the board connecting portion 32.

Accordingly, according to the invention, the second reinforcing plate (SUS-plate) 2 used in the board connecting portion 32 is machined into a non-planar shape.

Specifically, a portion of the second reinforcing plate 2 is provided with a louvered portion 20 in which a louvered shape (sterically enhanced shape) is formed.

In the embodiment, the portion of the second reinforcing plate 2 where the sterically enhanced shape is formed is called "additional enhancement portion." As illustrated in the drawings, the louvered portion 20 is provided by machining the second reinforcing plate 2 to form, in a region to which the FPC 18 is not attached, the louvered shape by pressing. Consequently, the rigidity of the second reinforcing plate 2 of the board connecting portion 32 can be enhanced.

The louvered portion 20 is provided around the screw portion 40 provided to fix the FPC with a screw (not shown).

There are the following reasons for providing the louvered portion 20 around the screw portion 40. First, a load tends to be applied to an area around the screw portion 40 in the second reinforcing portion 2. The load can be reduced by providing the louvered portion 20 therein.

On a region in the second reinforcing plate 2 to which the FPC is attached, electronic chips such as a capacitor, connectors, and the like are mounted. The mechanical strength of the region is increased by such components. On the other hand, the area around the screw portion 40 remains to be low in the strength. Thus, the mechanical strength of the area can be increased by providing the louvered portion 20 therein.

Preferably, in the present embodiment, the louvered shapes formed in the louvered portion 20 are concentric circles, as illustrated in FIG. 2. Thus, the directionality of the strength can be prevented from being biased.

The surface area of the second reinforcing member (reinforcing plate) 2 formed of a SUS-plate can be increased by the above louvered shapes. Accordingly, the louvered shapes also have an advantage in enhancing heat radiation performance.

That is, according to the above embodiment, each of the first reinforcing plate 1 and the second reinforcing plate 2 can be formed using substantially the same material. Thus, the above embodiment has an advantage in enhancing the manufacturability of a magnetic disk apparatus.

In addition, the above embodiment has another advantage in achieving both of the reduction in the weight of the first reinforcing plate 1 and the increase in the rigidity of the second reinforcing plate 2.

In addition, the above embodiment has another advantage in enhancing the heat radiation performance of the second reinforcing plate 2.

FIGS. 3A to 3E are diagrams illustrating another embodiment of an electronic substrate having an FEC and reinforcing members.

The FPC 18 is provided with the head connecting portion 31 at which the terminal to be connected the magnetic head 14 is disposed, and the board connecting portion 32 at which the terminal to be connected to the main printed board is disposed. The magnetic head 14 and the main printed board are electrically connected to each other via the FPC 18.

Similarly to the above embodiment, the head connecting portion 31 to which the first reinforcing member (reinforcing plate) 1 is attached is fixed to the head actuator 15. Similarly, the second reinforcing member (reinforcing plate) 2 formed of a SUS-plate is attached to the board connecting portion 32 of the FPC 18. Thus, the board connecting portion 32 is reinforced.

Reference numeral 30 designates a folded-back portion in which the second reinforcing member is formed to be folded back to have a sterically enhanced shape.

Figure 3A:
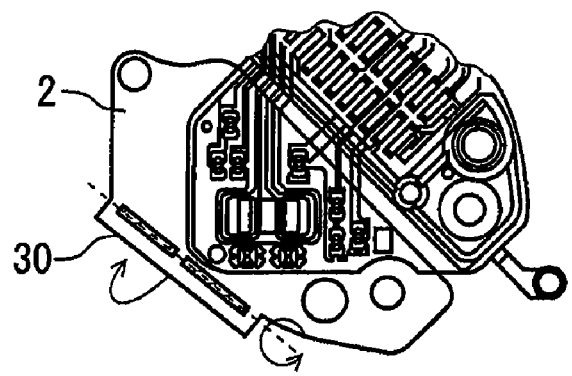
FIGS. 3A to 3E are diagrams illustrating examples of an electronic substrate having an FPC and reinforcing members according to another embodiment.

As illustrated in FIG. 3A, the folded-back portion 30 is provided in the second reinforcing member (reinforcing plate) 2.

Figure 3B:
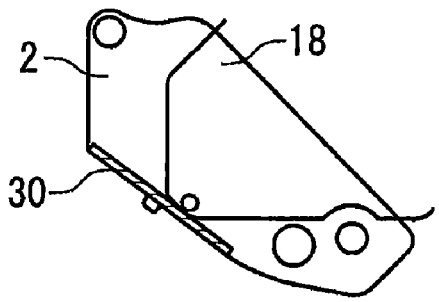

FIG. 3B illustrates an example of providing the folded-back portion 30 in an end portion of the second reinforcing member (reinforcing plate) 2.

Figure 3C:
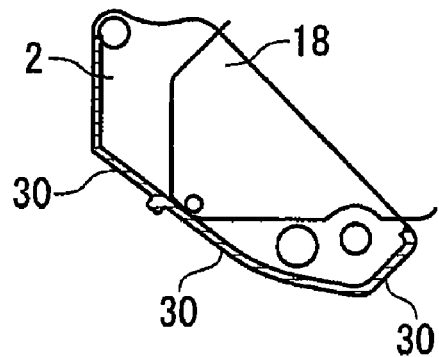

FIG. 3C illustrates an example of providing the folded-back portion 30 in each of three surrounding end portions of the second reinforcing member (reinforcing plate) 2.

Figure 3D:
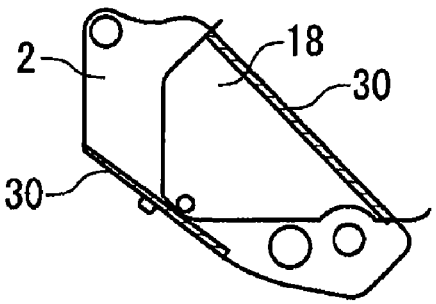

FIG. 3D illustrates an example of providing the folded-back portion 30 in each of two opposed end portions of the second reinforcing member (reinforcing plate) 2.

Figure 3E:
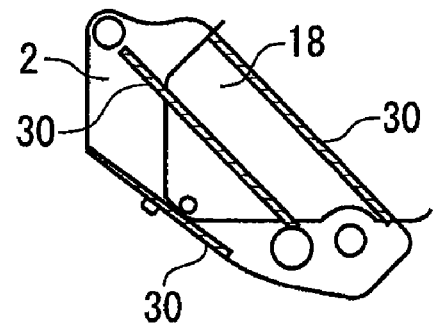

FIG. 3E illustrates an example of providing the folded-back portion 30 in each of two opposed end portions of the second reinforcing member (reinforcing plate) 2 and a portion between the two opposed end portions thereof.

The provision of the folded-back portions 30 has the advantage in increasing the rigidity of the second reinforcing plate 2.

Similarly to the above embodiment, the present embodiment has advantages in using substantially the same material as the materials of the first reinforcing plate 1 and the second reinforcing plate 2 and in increasing the manufacturability of a magnetic disk apparatus.

The present embodiment has another advantage in achieving both of the reduction in the weight of the first reinforcing plate 1 and the increase in the rigidity of the second reinforcing plate 2.

The present embodiment has another advantage in enhancing the heat radiation performance of the second reinforcing plate 2.

Figure 4A:
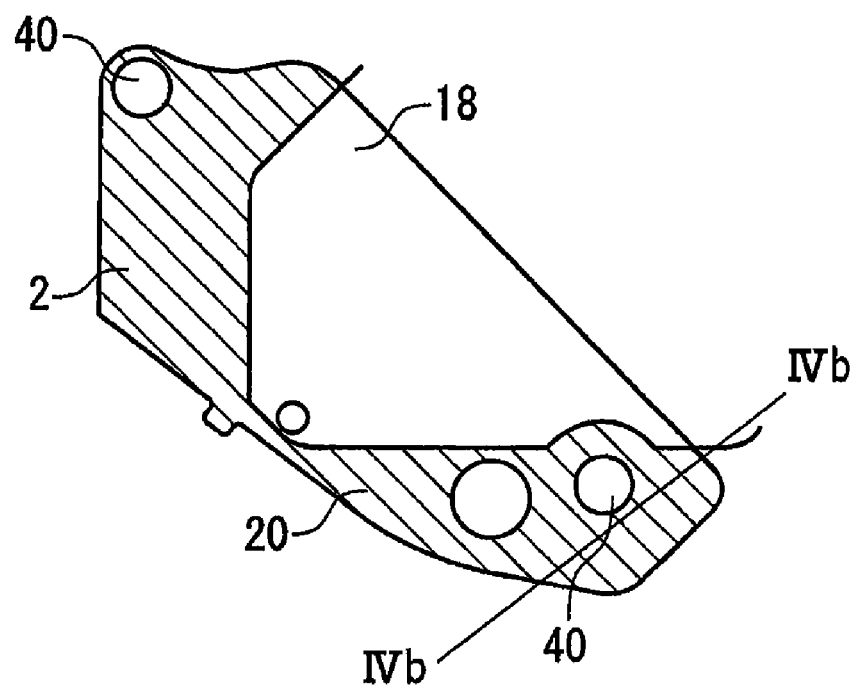
FIGS. 4A and 4B are diagrams illustrating an example of an electronic substrate having an FPC and reinforcing members according to still another embodiment.
Figure 4B:

FIGS. 4A and 4B are diagrams illustrating another embodiment of an electronic substrate having an FPC and reinforcing members according to the invention. Similarly to the above embodiments, the head connecting portion 31 to which the first reinforcing member (reinforcing plate) 1 is attached is fixed to the head actuator 15. Similarly, the second reinforcing member (reinforcing plate) 2 formed of a SUS-plate is attached to the board connecting portion 32 of the FPC 18. Thus, the board connecting portion 32 is reinforced.

As illustrated in FIG. 4A, a louvered portion 20 is provided in the second reinforcing member (reinforcing plate) 2.

FIG. 4B illustrates a cross-section taken on line IVb-IVb illustrated in FIG. 4A.

In this embodiment, the louvered portion 20 is provided in the second reinforcing member (reinforcing plate) 2 to connect the screw portions 40 and 40.

Alternatively, as described above, a folded-back portion 30 can be provided therein, instead of the louvered portion 20.

For example, a portion of the folded-back shape can be machined into a louvered portion (having a louvered shape) 20 or a folded-back portion 30, which has a small number of ribs.

Similarly to the above embodiments, the present embodiment has advantages in using substantially the same material as the materials of the first reinforcing plate 1 and the second reinforcing plate 2 and in increasing the manufacturability of a magnetic disk apparatus.

In addition, the present embodiment has the advantage in achieving both of the reduction in the weight of the first reinforcing plate 1 and the increase in the rigidity of the second reinforcing plate 2.

In addition, the present embodiment has the advantage in enhancing the heat radiation performance of the second reinforcing plate 2.

Figure 5A:
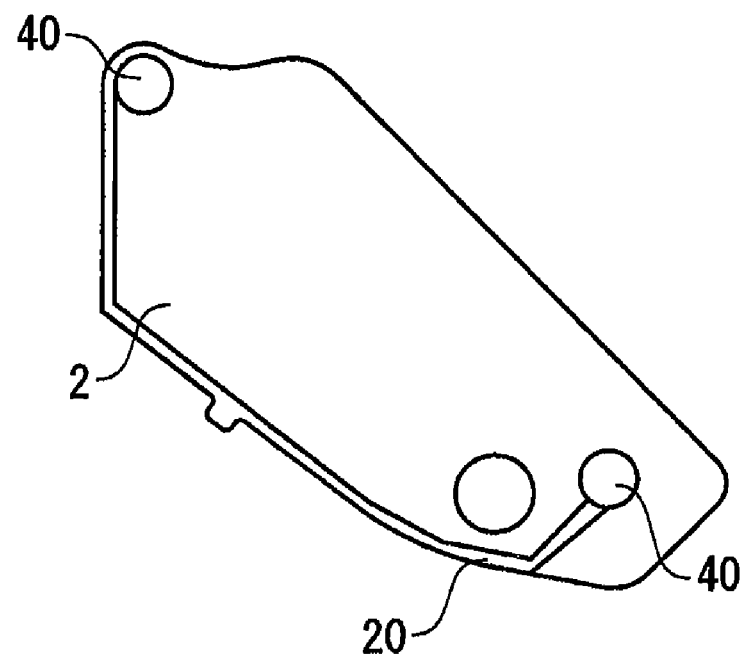
FIGS. 5A and 5B are diagrams illustrating examples of an electronic substrate having an FPC and reinforcing members according to still another embodiment.
Figure 5B:
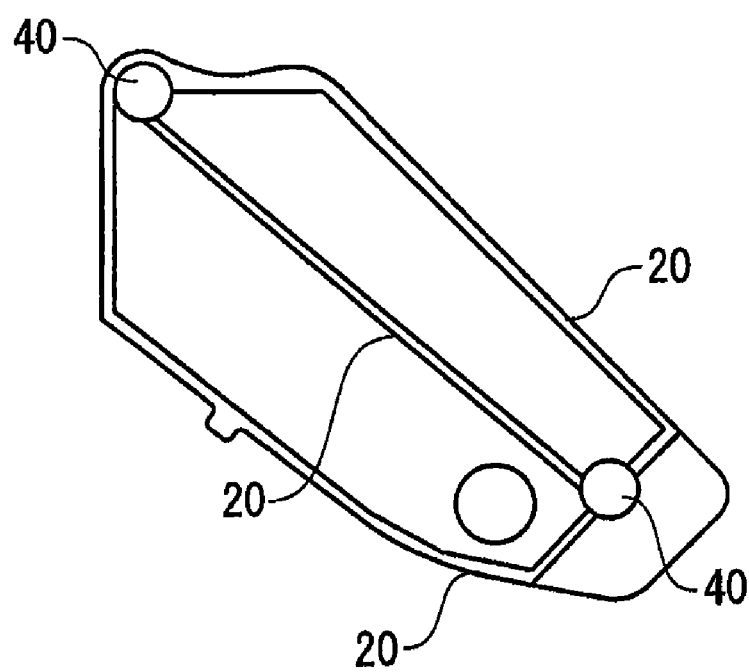

FIGS. 5A and 5B are diagrams illustrating another embodiment of an electronic substrate having an FPC and reinforcing members according to the invention.

FIG. 5A illustrates an example of providing the louvered portion 20 at an end portion of the second reinforcing member (reinforcing plate) 2.

FIG. 5B illustrates an example of providing the louvered portions 20 at an end portion of the second reinforcing member (reinforcing plate) 2, another end portion thereof opposed to the former end portion thereof, and a portion located between the opposed end portions thereof, respectively.

Similarly to the above embodiments, the present embodiment has advantages in using substantially the same material as the materials of the first reinforcing plate 1 and the second reinforcing plate 2 and in increasing the manufacturability of a magnetic disk apparatus.

In addition, the present embodiment has the advantage in achieving both of the reduction in the weight of the first reinforcing plate 1 and the increase in the rigidity of the second reinforcing plate 2.

As described above, the present embodiment has advantages in using substantially the same material as the materials of the first reinforcing plate 1 and the second reinforcing plate 2 and increasing the manufacturability of a magnetic disk apparatus.

In addition, the present embodiment has the advantage in achieving both of the reduction in the weight of the first reinforcing plate 1 and the increase in the rigidity of the second reinforcing plate 2.

In addition, the present embodiment has the advantage in enhancing the heat radiation performance of the second reinforcing plate 2.

Although the embodiments according to the present invention have been described above, the present invention may not be limited to the above-mentioned embodiments but can be variously modified. Components disclosed in the aforementioned embodiments may be combined suitably to form various modifications. For example, some of all components disclosed in the embodiments may be removed or may be appropriately combined.

Additional advantages and modifications will readily occur to those skilled in the art. Therefore, the invention in its broader aspects may not be limited to the specific details and representative embodiments shown and described herein. Accordingly, various modifications may be made without departing from the spirit or scope of the general inventive concept as defined by the appended claims and their equivalents.

What is claimed is:

1. An electronic substrate comprising:
a flexible printed circuit comprising a head connecting portion having a first terminal for electrically connecting to a magnetic head, a board connecting portion having a second terminal for electrically connecting to a main printed board, and a connector connecting portion for electrically connecting a connector;
a first reinforcing member provided on the head connecting portion, the first reinforcing member reinforcing the head connecting portion;
a second reinforcing member provided on the board connecting portion, the second reinforcing member reinforcing the board connecting portion; and
a third reinforcing member provided on the connector connecting portion, the third reinforcing member reinforcing the connector connecting portion,
wherein the flexible printed circuit is partly bent to make the board connecting portion and the connector connecting portion overlap each other, and
wherein the second reinforcing member comprises a screw portion for fixing the flexible printed circuit with a screw, and an additional enhancement portion formed around the screw portion with a louvered shape.

2. The electronic substrate of claim 1,
wherein the louvered shape is arranged in concentrically circular shape.

3. The electronic substrate of claim 1,
wherein the additional enhancement portion is improved in heat radiation performance by the louvered shape.

4. A magnetic disk apparatus comprising:
a magnetic disk;
a magnetic head configured to read information recorded on the magnetic disk;
a flexible printed circuit comprising a head connecting portion having a first terminal for electrically connecting to the magnetic head, a board connecting portion having a second terminal for electrically connecting to a main printed board, and a connector connecting portion for electrically connecting a connector;
a first reinforcing member provided on the head connecting portion, the first reinforcing member reinforcing the head connecting portion;
a second reinforcing member provided on the board connecting portion, the second reinforcing member reinforcing the board connecting portion; and
a third reinforcing member provided on the connector connecting portion, the third reinforcing member reinforcing the connector connecting portion,
wherein the flexible printed circuit is partly bent to make the board connecting portion and the connector connecting portion overlap each other, and
wherein the second reinforcing member comprises a screw portion for fixing the flexible printed circuit with a screw, and an additional enhancement portion formed around the screw portion with a louvered shape.

5. The apparatus of claim 4,
wherein the louvered shape is arranged in concentrically circular shape.

6. The apparatus of claim 4,
wherein the additional enhancement portion is improved in heat radiation performance by the louvered shape.

* * * * *